United States Patent [19]

Culican et al.

[11] Patent Number: 4,825,178

[45] Date of Patent: Apr. 25, 1989

[54] OSCILLATOR WITH NOISE REJECTION AND SQUARE WAVE OUTPUT

[75] Inventors: Edward F. Culican, Hyde Park; John D. Davis, Beacon; Martin E. Powell, Poughkeepsie; Philip E. Pritzlaff, Jr., Highland, all of N.Y.

[73] Assignee: International Business Machines Corporation, Armonk, N.Y.

[21] Appl. No.: 89,711

[22] Filed: Aug. 26, 1987

[51] Int. Cl.⁴ .......................... H03B 5/36; H03K 5/08
[52] U.S. Cl. ................................. 331/116 R; 331/75;
331/158; 307/261
[58] Field of Search ........ 331/116 R, 116 FE, 117 R,
331/117 FE, 158, 159, 167, 168, 74, 75; 328/28,
31; 307/261

[56] References Cited

U.S. PATENT DOCUMENTS

| | | | |
|---|---|---|---|
| 3,479,812 | 11/1969 | Kramer | 331/116 R X |
| 3,868,606 | 2/1975 | Driscoll | 333/80 T |
| 4,068,462 | 1/1978 | Duff et al. | 331/175 X |
| 4,096,451 | 6/1978 | Pradal | 331/116 R |
| 4,179,671 | 12/1979 | Yoshida et al. | 331/116 FE |
| 4,223,524 | 9/1980 | Nakagawa | 368/156 |
| 4,283,691 | 8/1981 | Burgoon | 331/116 R |
| 4,383,224 | 5/1983 | Saari | 331/74 |
| 4,536,721 | 8/1985 | Charbonnier | 331/116 R |
| 4,550,293 | 10/1985 | Driscoll | 331/116 R |
| 4,583,059 | 4/1986 | Konno | 331/158 |
| 4,591,808 | 5/1986 | Lucas et al. | 331/116 FE |
| 4,600,899 | 7/1986 | Kennedy | 331/116 R |
| 4,613,829 | 9/1986 | Ott | 331/59 |

Primary Examiner—Siegfried H. Grimm
Attorney, Agent, or Firm—William T. Ellis

[57] ABSTRACT

An oscillator with noise rejection which may be used in a gate array in a semiconductor chip including a first amplifier circuit, a circuit, for connecting an external feedback element (crystal) across the input and inverting output of the first amplifier circuit for generating and amplifying a sine wave, and a circuit connected to the inverting output of the first amplifier circuit for generating a square wave with the duty cycle thereof being proportional to the difference between the center of the voltage swing of the amplified sine wave and a reference voltage. In a preferred embodiment, the first amplifier circuit and the generating circuit each include a current switch. A voltage reference network is provided to set the reference voltage for the current switch in the generating circuit to the center of the voltage swing of the sine wave applied to that current switch. This results in a 50% duty cycle square wave for the output signal. A current source voltage reference is included for ensuring that each of the current switches and the voltage reference network drive approximately constant equal currents.

13 Claims, 1 Drawing Sheet

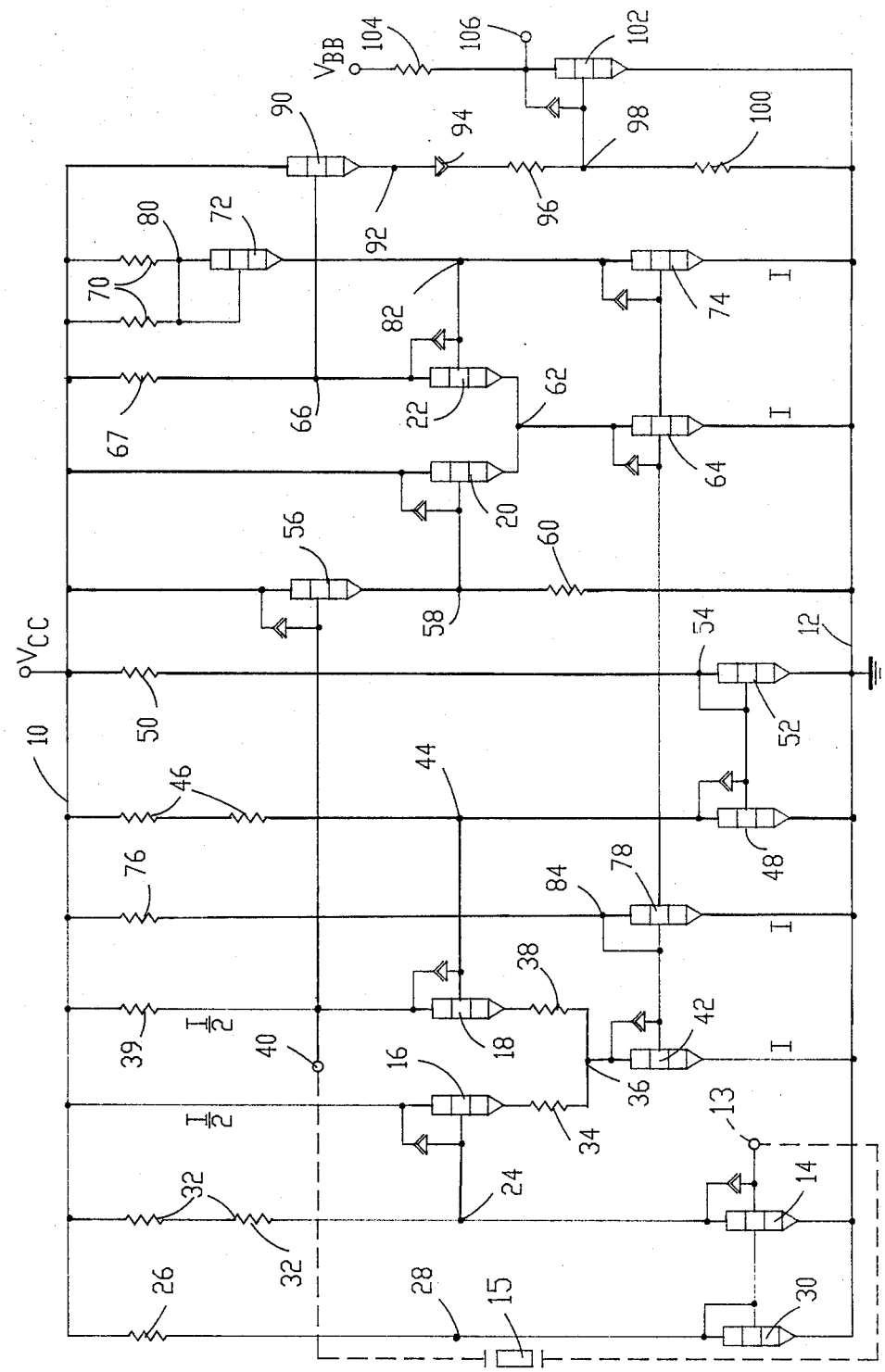

OSCILLATOR WITH NOISE REJECTION AND SQUARE WAVE OUTPUT

BACKGROUND OF THE INVENTION

The present invention relates generally to electronic oscillators, and in particular to electronic oscillator circuits formed in gate array cells.

An oscillator circuit is required on many semiconductor chips to generate a sine and/or square wave (off-chip). This square wave is then used as a clock signal for both on-chip and off-chip circuits Prior art oscillator circuits suffer from significant signal-to-noise degradation due to noise injection at the points where externally connected elements are applied to the chip. In a typical configuration, the lines from an external crystal are connected across the input and inverting output of an amplifier to obtain the required feedback for oscillation. The non-inverting output then presents a square wave. However, such a connection causes external noise injected at the input line of the amplifier to be amplified. This noise amplification seriously degrades the signal-to-noise ratio at the non-inverting output of the circuit.

The invention as claimed is intended to remedy the above-described noise amplification problem while maintaining an approximate 50% duty cycle.

SUMMARY OF THE INVENTION

Briefly, the present invention comprises an oscillator with noise rejection, comprising:

first amplifier means with an input and an inverting output;

means for connecting an external feedback element across the input and the inverting output of the first amplifier means so that a sine wave is generated and amplified; and means connected to the inverting output for generating a square wave with the duty cycle being proportional to the difference between the center of the voltage swing of the amplified sine wave and a reference voltage.

In a preferred embodiment, the first amplifier means comprises a first amplifier with its input connected to one end of the external feedback element, and having an inverting output; and first current switch means with a first control line thereof connected to the inverting output of the first amplifier, with a second control line connected to a reference, and an output line for providing an output in response to signals on the first control line, and further including a first constant current source. Note that this output line is also connected to the second end of the external crystal. The square wave generating means in this embodiment includes second current switch means with a first control line, a second control line, and an output line for providing an output in response to signals on the first control line thereof, wherein the output line from the first current switch means is connected to control the signal on the first input line of the second current switch means, and further including a second constant current source;

a voltage reference network connected to the second control line of the second current switch means; and current source voltage reference means for controlling the constant current sources for the first and second current switch means and the voltage reference network to drive approximately constant equal currents.

In a preferred embodiment, the first and second current switch means include means for providing non-inverting outputs in response to signals on their respective first control lines. The circuit may further comprise voltage level shifting means for shifting the voltage level of the signal on the output line of the second current switch means; and second amplifier means for amplifying the level-shifted signal from the level-shifting means.

The present invention may be conveniently implemented on a gate array chip utilized with an external crystal.

BRIEF DESCRIPTION OF THE DRAWING

The FIGURE is a schematic circuit diagram of one embodiment of the present invention.

DETAILED DESCRIPTION OF THE PREFERRED EMBODIMENT

The present invention is directed to a crystal oscillator with noise rejection and an approximate fifty percent duty cycle characteristic. The invention will be described in a configuration utilizing bipolar transistors. However, it should be clear to one skilled in the art that the invention is not limited to bipolar transistors, but rather may be implemented by a variety of different switching devices.

The circuit shown in the FIGURE includes a power supply line 10; a first voltage reference 12; first amplifier means, which comprises the transistors 14, 16 and 18; and means for generating a square wave from a sine wave, including the transistors 20 and 22. An external feedback element 15 of some type, such as a crystal, may be connected across the terminals of the first amplifier means to provide a sine wave thereto for amplification. Specific circuitry is included with the transistors 20 and 22 to ensure that the generated square wave has and maintains an approximate 50% duty cycle characteristic.

As noted above, the first amplifier means includes the transistors 14, 16 and 18. The transistor 14 (first transistor) has its emitter connected to the first voltage reference 12 and its collector to a node 24 (second node). Base-biasing for transistor 14 is provided by a resistor 26 connected between the power supply line 10 and a node 28, disposed in series with a diode-connected transistor 30 (collector and base are shorted) connected between the node 28 and the first voltage reference 12. This resistor-diode configuration ensures a constant voltage drop across the resistor 26. The base of transistor 14 is connected to node 28. A resistor 32 is connected between the power supply line 10 and node 24 in order to invert the amplified signal from transistor 14.

The transistors 16 and 18 of the first amplifier means are connected to form a first current switch. The base of transistor 16 (second transistor) is connected to node 24, and its collector is connected to the power supply line 10. The emitter of transistor 16 is connected through a feedback resistor 34 to a node 36 (first node). The emitter of transistor 18 (third transistor) is connected through a feedback resistor 38 to node 36. The collector of transistor 18 is connected to a node 40 (third node).

A load resistor 39 is connected between the power supply line 10 and node 40. A current source transistor 42 is disposed with its collector connected to node 36 and with its emitter connected to the first reference voltage 12. Current source transistor 42 provides a constant current to be divided by the transistors 16 and 18.

The base of transistor 18 is connected to node 44. A resistance 46 is connected between the power supply line 10 and node 44, and a constant-current transistor 48 is connected between node 44 and the first reference voltage 12. The resistance 46-transistor 48 combination provides an approximately constant biasing reference voltage to node 44 and the base of transistor 18. A resistor 50-diode 52 combination is used to maintain the voltage at the base of transistor 48 at a constant reference bias. The resistor 50 is connected between the power supply 10 and a node 54, and the diode 52 (a base-collector shorted transistor) is connected between node 54 and the first reference voltage 12, so that a constant voltage drop is achieved across the resistor 50.

Note that the resistors 34 and 38 in the first current switch perform a negative feedback function. For example, if the voltage at node 24 rises, then the emitter of transistor 16 rises. But the increased current through transistor 16 increases the voltage drop across resistor 34. Thus, resistor 34 detracts from the gain of transistor 16 and forces the circuit to require a larger voltage rise at node 24 before node is pulled up high enough to turn off transistor 18. Note also that the first current source, as configured in the drawing, does not invert the signal provided at node 24.

The external crystal 15 is connected between the base 13 of transistor 14 and node 40. Accordingly, a sine wave at the external crystal input is amplified by the inverting transistor 14 and the first current switch (transistors 16 and 18). However, because the external crystal in combination with the first amplifier means (transistors 14, 16 and 18) forms a circuit tuned at the frequency of the external crystal, external noise injected at the base of transistor 14 is not amplified, with the exception of the nominal amount of noise at the oscillator frequency itself.

Accordingly, the signal at node 40 is an amplified sine wave with noise rejection. This sine wave is fed back through the crystal to reinforce the noise at the crystal frequency and thereby sustain oscillation. The sine wave signal is also applied to the base of an emitter follower transistor 56, which operates to voltage shift the sine wave signal down by the base-emitter voltage drop of transistor 56. Transistor 6 is disposed with its collector connected to the power supply line 10 and with its emitter connected to a node 58 (sixth node). A resistor 60 is connected between node 58 and the first voltage reference 12.

The previously-mentioned transistors 20 and 22 are formed in a second current switch configuration. Transistor 20 (sixth transistor) is disposed with its collector connected to the power supply line 10 and with its emitter connected to a node 62 (fourth node). Likewise, transistor 22 (seventh transistor) is disposed with its collector connected to a node 66 and with its emitter connected to the node 62. A current source transistor 64 (eighth transistor) is disposed with its collector connected to node 62 and with its emitter connected to the first voltage reference 12, for providing an approximately constant current to be divided by the transistors 20 and 22. The base of transistor 20 is connected to node 58. A load resistor 67 (third resistor) is connected between the power supply line 10 and node 66.

The second current switch is provided with a reference biasing voltage at the base of transistor 22 to ensure that the threshold of the current switch is at the center of the voltage swing of node 58. This biasing results in an approximate fifty percent duty cycle.

The above-referenced biasing is accomplished, in one embodiment, by means of the resistance 70 in combination with diode-connected transistor 72, a transistor 74, a resistor 76, and a diode-connected transistor 78. The resistance 70 is connected between the power supply line 10 and a node 80 (eighth node). The diode 72 is connected between node 80 and a node 82 (ninth node). The transistor 74 is disposed with its collector connected to node 82 and with its emitter connected to the first voltage reference 12.

The resistor 76 and the diode 78 are connected to form a constant reference voltage at a node 84. The resistor 76 is connected between the power supply line 10 and the node 84, while the diode 78 is disposed with its anode (shorted base-collector) connected to node 84 and with its cathode (emitter) connected to the first voltage reference 12. With these connections, a constant current flows through resistor 76, resulting in a constant voltage drop thereacross, and a constant voltage at node 84. Appropriate resistor values are chosen so that when the bases of the current source transistors 42, 64 and 74 are connected to node 84, they all supply approximately the same current, I.

At the center of the voltage swing of the amplified sine wave at node 40, both transistors 16 and 18 are conducting current equally from the current source transistor 42. Accordingly, both collectors are drawing a current I/2. Thus, the voltage at node 40 is the power supply voltage VCC—(I/2)(R39). This voltage center is then dropped down by the base-emitter voltage drop of the transistor 56. Thus, the voltage at node 58 is VCC—(I/2)(R39)—$V_{BE56}$. In contrast, the voltage at node 82 where the reference biasing occurs for the second current switch, is VCC—(I)(R70)—$V_{BE72}$. Thus, the switching threshold for the second current switch is made equal to the center of the voltage swing for the amplified sine wave by equating the resistance R39 to twice the resistance R70. This resistance-setting ensures that the threshold for current switching of the second current switch takes place at the center of the voltage swing of the sine wave applied to node 58.

In operation, assume that the sine wave is at the low end of its cycle at node 58. In this case, transistor 20 is not conducting and transistor 22 is drawing all of the current from the current source transistor 64 through resistor 67. This current flow results in a low voltage at node 66. As the sine wave voltage rises to the center of its swing, the bias voltages on nodes 58 and 82 are equal. As the sine wave voltage rises above the biasing voltage on node 82, it pulls the voltage at node 62 up with it. This node 62 voltage rise abruptly turns off transistor 22, because its base bias voltage on node 82 is held constant (the $V_{BE}$ drop for transistor 22 will not sustain conduction). Thus, current is no longer drawn through resistor 67 and node 66 rises in voltage.

The square wave at node 66 resulting from this current switching may then be level-shifted and amplified, as appropriate. In the Figure, node 66 is connected to the base of an emitter-follower transistor 90. The collector of this transistor 90 is connected to the power supply line 10, while its emitter is connected to a node 92. A Schottky diode 94 and a resistor 96 are connected in series between node 92 and a node 98. A resistor 100 is connected between node 98 and the first voltage reference 12. The Schottky diode 94 in combination with the resistors 96 and 100 act as a voltage divider network to further reduce the level of square wave voltage. The signal at node 98 is then connected to the input of an inverting amplifier, represented in the Figure by transistor 102 in combination with the resistor 104. The resistor 104 is connected between a power supply $V_{BB}$ (that may be different from power supply line 10) and an output node 106. The collector of the transistor 102 is connected to node 106, while its emitter is connected to the first voltage reference 12, and its base is connected to node 98. The resulting voltage-shifted and amplified square-wave output is present at node 106 for use in various applications.

Note that many of the transistors shown in the Figure include a Schottky diode connected across the base and collector terminals of the transistor to prevent transistor saturation. However, on most of the devices the Schottky diode may be removed without degrading current performance.

With the present circuit, the amplification (by transistors 14, 16, 18) between the base node 13 of transistor 14 and node 40 is high Q, so that only the desired oscillator signal is amplified. The noise injected at the base of transistor 14 is not amplified and is equivalent to the noise injected at node 40. However, the desired sine wave oscillation injected at the base of transistor 14 has been amplified, so that it might, for example, be ten times greater at node 40 than the input signal at the base transistor 14. Since the noise level is unchanged at node 40 (no noise was amplified, except noise at the sine wave frequency), the signal-to-noise ratio is improved at node 40 by +20 dB, relative to the base of transistor 14. This improvement is directly translated to the output square wave taken either at node 66 or node 106. Thus, this new circuit provides an output with a +20 dB advantage in signal-to-noise ratio, in the example.

Note that the second current switch (transistors 20 and 22) further amplifies the signal while transforming the sine wave signal to a square wave signal with a 50% duty cycle. This duty cycle is accomplished by tracking the center of the sine wave swing via a biasing network. Such a duty cycle is preferred for clocking applications.

It should be noted that the preferred embodiment was implemented with current switches. The use of current switches provides a stable DC operating point for the circuit, while reducing the number of chip I/O's required. In particular, the standard external bypass capacitor used across the amplifier's emitter resistances is eliminated.

While the present invention has been particularly shown and described with reference to preferred embodiments therefor, it will be understood by those skilled in the art that the foregoing and other changes in form and detail may be made therein without departing from the spirit and the scope of the present invention, as defined in the appended claims.

We claim:

1. An oscillator circuit having noise rejection, comprising:
    a first amplifier with an input line and an inverting output line;
    first current switch means with a first control line connected to the inverting output line of said first amplifier, a second control line connected to a reference, and an output line;
    a feedback element connected between said input line of said first amplifier and the output line of said first current switch means for generating a sine wave thereacross; and
    second current switch means with a first control line, a second control line connected to a reference, and an output line, wherein said output line from said first current switch means is connected to control the signal n said first control line of said second current switch means, said second current switch means including means for converting a sine wave on said output line of said first current switch means to a square wave.

2. An oscillator as defined in claim 1, wherein said converting means includes means for generating said square wave with a duty cycle proportional to the difference between the center of the voltage swing of said sine wave and a reference voltage.

3. An oscillator as defined in claim 2, wherein said converting means includes means for causing a current switch threshold for said second current switch at approximately the center of the voltage swing of said sine wave applied to the first control line of said second current switch.

4. An oscillator as defined in claim 3, wherein said first and second current switch means each include a respective current source; and
    wherein said converting means includes a voltage reference network for providing the reference for the second control line in said second current switch means; and
    current source voltage reference means for controlling and making the currents in said respective current sources in said first and second current switch means and in said voltage reference network approximately equal.

5. An oscillator as defined in claim 4, further comprising:
    means for shifting the voltage level of the signal on the output line of said second current switch; and
    a second amplifier for amplifying the signal at the output of said voltage shifting means.

6. An oscillator as defined in claim 1, further comprising:
    means for shifting the voltage level of the signal on the output line of said second current switch; and
    a second amplifier for amplifying the signal at the output of said voltage shifting means.

7. An oscillator as defined in claim 1, wherein said first and second current switch means each include a respective current source; and
    wherein said converting means includes a voltage reference network for providing the reference for the second control line in said second current switch means; and
    current source voltage reference means for controlling and making the currents in said respective current sources in said first and second current switch means and in said voltage reference network approximately equal.

8. An oscillator circuit having noise rejection, comprising:
    a plurality of bipolar transistors, each of said bipolar transistors having an emitter, base, and collector, said plurality of bipolar transistors including,
    a first node;
    a first transistor;
    a first voltage reference;
    a first current switch comprising a second transistor and a third transistor with their respective emitters connected via resistors to said first node, said first current switch including a fourth transistor with its collector connected to said first node to provide an approximately constant current thereto, and with its emitter connected to said first voltage reference, said first current switch further including a second voltage reference connected to the base of said third transistor;

a second node to which the collector of said first transistor and the base of said second transistor are connected;

a fifth transistor;

a third node to which the base of said fifth transistor and the collector of said third transistor are connected;

a power supply;

a first resistor connected between said power supply and said second node;

a second resistor connected between said power supply and said third node;

a second current switch comprising a sixth transistor and a seventh transistor, with their respective emitters connected to a fourth node, said second current switch including an eighth transistor with its collector connected to said fourth node to provide an approximately constant current thereto and with its emitter connected to said first voltage reference;

a sixth node to which the emitter of said fifth transistor and the base of said sixth transistor are connected;

a third resistor connected between said power supply and the collector of said seventh transistor;

a ninth transistor with its emitter connected to said first voltage reference;

a seventh node to which is connected the bases of said fourth transistor, said eighth transistor, and said ninth transistor;

a first diode connected between said seventh node and said first voltage reference;

a fourth resistor connected between said power supply and said seventh node;

an eighth node;

a fifth resistor connected between said power supply and said eighth node;

a ninth node to which is connected the base of said seventh transistor and the collector of said ninth transistor;

a second diode connected between said eighth and ninth nodes; and a crystal connected between the base of said first transistor and said third node for providing a feedback to the circuit, wherein the signal at the collector of said seventh transistor is a square wave with the duty cycle being proportional to the difference at the center of the voltage swing at said sixth node and the voltage reference at the ninth node.

9. An oscillator as defined in claim 8, further comprising:

means for shifting the voltage level of the signal at the collector of said seventh transistor and providing the level shifted signal at its output; and an amplifier for amplifying the signal at the output of said level shifting means.

10. An oscillator with noise rejection comprising:

a first amplifier with an input and an inverting output;

first current switch means with a first control line thereof connected to the inverting output of said first amplifier, with a second control line connected to a reference, and an output line for providing an output in response to signals on said first control line, and including a first constant current source;

means for connecting an external crystal across the input of said first amplifier and the output line of said first current switch means so that a sine wave is generated and amplified; and means connected to said inverting output for generating a square wave from said amplified sine wave signal by switching when said amplified sine wave crosses a voltage threshold, said square wave generating means including means for generating said switching voltage threshold so that said voltage threshold is approximately equal to the center of the voltage swing for the amplified sine wave.

11. An oscillator as defined in claim 10, wherein said square wave generating means includes second current switch means with a first control line, a second control line, and an output line for providing an output in response to signals on said first control line thereof, wherein said output line from said first current switch means is connected to control the signal on said first control line of said second current switch means, and further including a second constant current source; and wherein said voltage threshold generating means comprises a voltage reference network connected to the second control line of said second current switch means for causing the switching threshold for said second current switch to be approximately equal to the center of the voltage swing of said sine wave applied to the first control line of said second current switch;

current source voltage reference means for controlling said first and second current switch means and said voltage reference network to drive approximately constant equal currents.

12. An oscillator as defined in claim 11, wherein said first and second current switch means include means for providing non-inverting outputs in response to signals on their respective first control lines.

13. An oscillator as defined in claim 12, further comprising:

voltage level shifting means for shifting the voltage level of the signal on the output line of said second current switch means; and second amplifier means for amplifying the level-shifted signal from said level shifting means.

* * * * *